US007816989B2

(12) United States Patent
Yuasa

(10) Patent No.: US 7,816,989 B2
(45) Date of Patent: Oct. 19, 2010

(54) DIFFERENTIAL AMPLIFIER

(75) Inventor: Tachio Yuasa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/379,679

(22) Filed: Feb. 26, 2009

(65) Prior Publication Data

US 2009/0231039 A1     Sep. 17, 2009

(30) Foreign Application Priority Data

Mar. 13, 2008 (JP) ............... 2008-064283
Aug. 28, 2008 (JP) ............... 2008-220391

(51) Int. Cl.
*H03F 3/45* (2006.01)
(52) U.S. Cl. ................................ 330/253
(58) Field of Classification Search ............ 330/253, 330/255, 257; 327/563
See application file for complete search history.

(56) References Cited

U.S. PATENT DOCUMENTS 5,293,136 A * 3/1994 Ryat ........................ 330/258

5,294,893 A    3/1994 Ryat

FOREIGN PATENT DOCUMENTS

JP          6-237128          8/1994

* cited by examiner

*Primary Examiner*—Robert Pascal
*Assistant Examiner*—Khiem D Nguyen
(74) *Attorney, Agent, or Firm*—McGinn IP Law Group PLLC

(57) ABSTRACT

A differential amplifier includes a first differential pair formed by transistors of a first conductivity type, to receive input signals and output first differential-mode currents, a first current amplifier section to output a first output source current and a first output sink current to a first output terminal and a second output terminal, respectively, based on the first differential-mode currents, a second differential pair formed by transistors of a second conductivity type, to receive the input signals and output second differential-mode currents, and a second current amplifier section to output a second output source current and a second output sink current to the first output terminal and the second output terminal, respectively, based on the second differential-mode currents.

5 Claims, 3 Drawing Sheets

DIFFERENTIAL AMPLIFIER

BACKGROUND

1. Field of the Invention

The present invention relates to a differential amplifier and, particularly, to a differential amplifier that includes a differential pair in an input section.

2. Description of Related Art

In recent semiconductor devices, the implementation size of a complementary metal-oxide-semiconductor field effect transistor (CMOSFET) that is used as a circuit component, for example, has become miniaturized. With such miniaturization, a voltage applicable to a MOSFET is decreasing. On the other hand, a demand for higher performance and lower power consumption is increasing in portable electronic equipment into which a semiconductor device is incorporated.

One approach to meet the demand for lower power consumption is to set a lower power supply voltage. However, as a power supply voltage is set lower, the operation and design of a circuit becomes more difficult. For example, there is a limit to a valid input voltage range in an enhancement FET, both an Nch MOSFET and a Pch MOSFET, which is often used in an LSI. Specifically, in an enhancement FET, there is a threshold voltage which indicates a voltage level that cannot be used as a valid input voltage in order to keep an output current in the off state (which is called "normally-off"), and an Nch MOSFET does not operate unless an input voltage is equal to or higher than the threshold voltage, and a Pch MOSFET does not operate unless an input voltage is equal to or lower than the threshold voltage. However, if a power supply voltage is lowered, the proportion of a threshold voltage range, which is a non-active region for an element, to a power supply voltage range increases. Accordingly, the proportion of a voltage range that cannot be used as a valid input voltage range increases. Further, the voltage of a signal in the circuit becomes the threshold voltage or lower, causing a part of the circuit to become inactive.

To address such an issue, a method for realizing a circuit capable of dealing with reduction of a power supply voltage by means of circuit technology has been proposed. For example, a method of enlarging a valid input voltage range without consideration of the existence of a threshold voltage has been proposed in the MOSFET technology. Specifically, a circuit is proposed that includes both a differential amplifier circuit having an Nch MOSFET as an input portion and a differential amplifier circuit having a Pch MOSFET as an input portion, combines output signals of both circuits and thereby obtains a final output signal. One example of a differential amplifier in which a differential pair at an input portion is formed by transistors of different polarities is disclosed in Japanese Unexamined Patent Application Publication No. 6-237128.

FIG. 3 shows a circuit diagram of a differential amplifier 100 disclosed in Japanese Unexamined Patent Application Publication No. 6-237128. The differential amplifier 100 is an amplifier that uses bipolar transistors. The differential amplifier 100 includes a first differential input stage formed by NPN transistors Q1 and Q2, a second differential input stage formed by PNP transistors Q3 and Q4, a first output stage formed by a PNP transistor QC1 and an NPN transistor QC5, and a second output stage formed by a PNP transistor QC2 and an NPN transistor QC6. In the differential amplifier 100, signals input to the first and second differential input stages are amplified and output through the first and second output stages.

The differential amplifier 100 uses a common-mode voltage feedback circuit to let the first and second output stages operate. The common-mode voltage feedback circuit of the differential amplifier 100 is formed by PNP transistors QC3 and QC4, NPN transistors QC7, QC8, Q5 and Q6, and constant current sources ICMP and ICMN. The common-mode voltage feedback circuit detects a common-mode voltage difference of output voltages and supplies a common-mode current corresponding to the detected common-mode voltage difference to the first and second output stages.

Thus, the differential amplifier 100 incorporates the first differential input stage formed by NPN transistors and the second differential input stage formed by PNP transistors, thereby enlarging the input voltage range. Further, the differential amplifier 100 enlarges the output voltage range by the operation of the common-mode voltage feedback circuit.

SUMMARY

However, the present inventor has found the following problem. In the differential amplifier 100, in order to make the common-mode voltage feedback circuit operate, it is necessary to supply a reference value, which is a constant voltage, to a connection node (a node N1 in FIG. 3) between the constant current sources ICMP and ICMN. This is because the common-mode voltage feedback circuit compares an output to be controlled with the reference value of the node N1 and makes control so that those values have a desired relationship. Thus, if the reference value becomes unstable, the circuit operation becomes defective. The conditions for maintaining the reference value constant are represented by the following expression (1) when a collector current flowing through a transistor x is IC(x), and currents generated by the constant current sources ICMP and ICMN are ICMP and ICMN, respectively.

$$ICMP + IC(QC3) + IC(QC4) = ICMN + IC(QC7) + IC(QC8) \qquad (1)$$

The current ICMP and the current ICMN are generally generated by transistors to which a bias voltage is applied. However, it is difficult to apply a stable bias voltage to all of a plurality of elements in a semiconductor device. Further, fluctuations during manufacture of transistors are inevitable. Therefore, it is very difficult to generate the stable currents ICMP and ICMN.

Further, the values of the currents IC (QC3), IC (QC4), IC (QC7) and IC (QC8) largely depend on the operating state of the circuit. For example, if the output is configured as push-pull in the differential amplifier 100, an output source current is obtained through an output terminal OUT2, and an output sink current is obtained through an output terminal OUT1 at the same time. However, it is very difficult to always maintain the relationship of the expression (1) in such a push-pull operation.

Thus, in the case of obtaining a push-pull output current for a rail-to-rail input with a wide input voltage range in the differential amplifier 100, it is difficult to allow the circuit to operate normally.

A first exemplary aspect of an embodiment of the present invention is a differential amplifier that includes a first differential pair formed by transistors of a first conductivity type, to receive input signals and output first differential-mode currents; a first current amplifier section to output a first output source current and a first output sink current to a first output terminal and a second output terminal, respectively, based on the first differential-mode currents; a second differential pair formed by transistors of a second conductivity type, to receive the input signals and output second differential-mode currents; and a second current amplifier section to output a second output source current and a second output sink current to the first output terminal and the second output terminal, respectively, based on the second differential-mode currents.

A second exemplary aspect of an embodiment of the present invention is a differential amplifier that includes a first differential pair formed by transistors of a first conductivity type, to receive input signals and output first differential-mode currents; a first reference current source to output a first reference source current and a first reference sink current; a first current amplifier section to output a first output source current generated based on a difference between the first reference source current and one first differential-mode current included in the first differential-mode currents to a first output terminal, and output a first output sink current generated based on a difference between the first reference sink current and the other first differential-mode current included in the first differential-mode currents to a second output terminal; a second differential pair formed by transistors of a second conductivity type, to receive the input signals and output second differential-mode currents; a second reference current source to output a second reference source current and a second reference sink current; and a second current amplifier section to output a second output source current generated based on a difference between the second reference source current and one second differential-mode current included in the second differential-mode currents to the first output terminal, and output a second output sink current generated based on a difference between the second reference sink current and the other second differential-mode current included in the second differential-mode currents to the second output terminal.

The differential amplifier according to the exemplary aspects of an embodiment of the present invention includes the first differential pair and the first current amplifier section corresponding to an upper input voltage range and the second differential pair and the second current amplifier section corresponding to a lower input voltage range. The output of the first current amplifier section and the output of the second current amplifier section are connected together, so that the output currents output from the two current amplifier sections are combined and output. This realizes a wide input voltage range and a wide output voltage range without using a common-mode feedback circuit.

According to the exemplary aspects of an embodiment of the present invention, it is possible to implement a differential amplifier capable of handling a rail-to-rail input and obtaining a push-pull output current.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
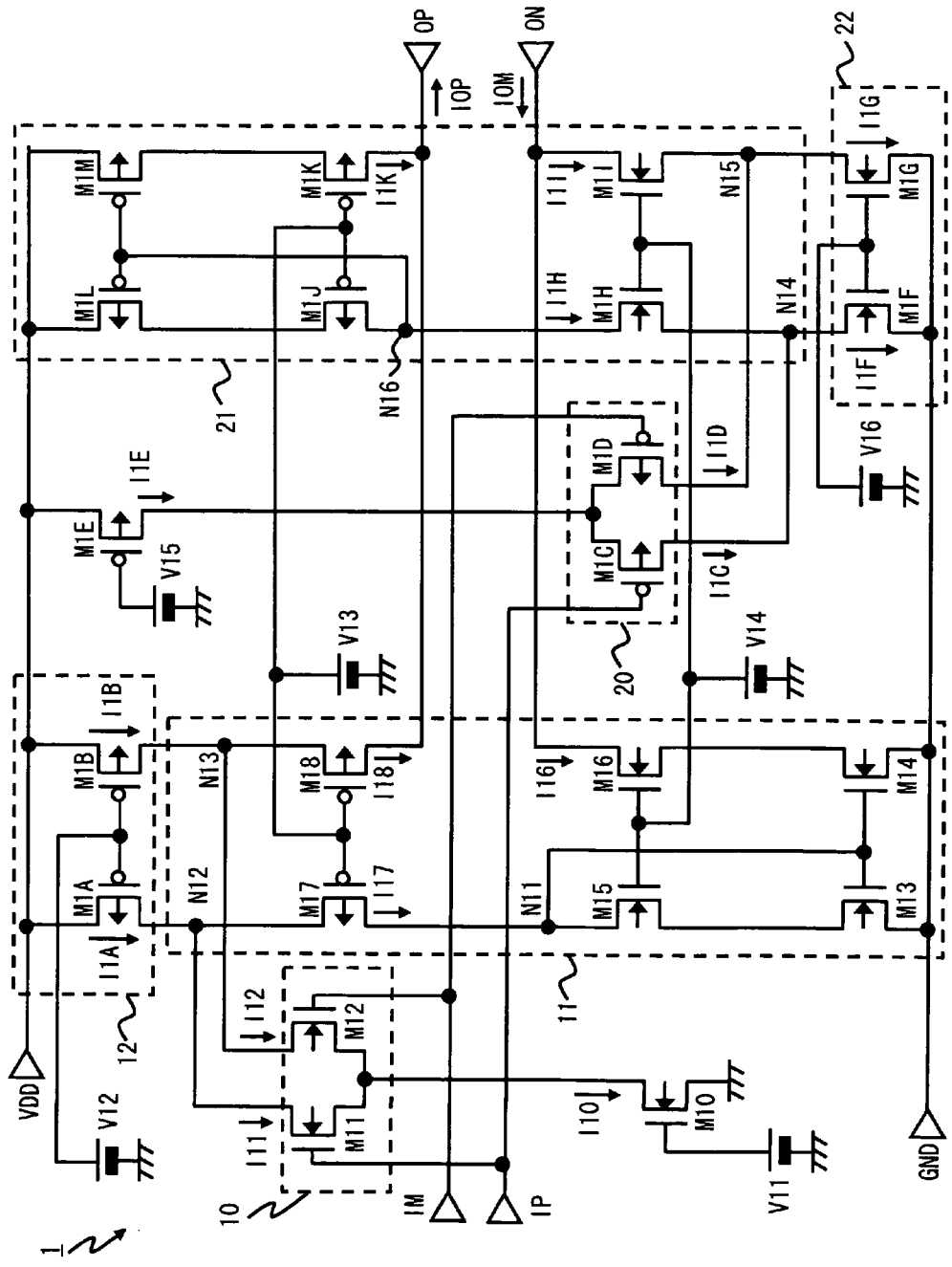
FIG. 1 is a circuit diagram of a differential amplifier according to a first exemplary embodiment.

An exemplary embodiment of the present invention is described hereinafter with reference to the drawings. FIG. 1 shows a circuit diagram of a differential amplifier 1 according to a first exemplary embodiment. Referring to FIG. 1, the differential amplifier 1 includes a first differential pair 10, a first current amplifier section 11, a first reference current source 12, a second differential pair 20, a second current amplifier section 21, and a second reference current source 22. Further, the differential amplifier 1 includes transistors M10 to M18 and M1A to M1M, voltage sources V11 to V16, a first input terminal IP, a second input terminal IM, a first output terminal OP, and a second output terminal ON. Although the differential amplifier 1 is configured using MOSFETs in this exemplary embodiment, it may be configured using bipolar transistors.

The first differential pair 10 is formed by transistors of a first conductivity type, and it receives input signals through the first input terminal IP and the second input terminal IM and outputs first differential-mode currents (currents I11 and I12). The second differential pair 20 is formed by transistors of a second conductivity type, and it receives input signals through the first input terminal IP and the second input terminal IM and outputs second differential-mode currents (currents I1C and I1D). The first current amplifier section 11 outputs a first output source current I18 and a first output sink current I16 to the first output terminal OP and the second output terminal ON, respectively, based on the first differential-mode currents I11 and I12. The second current amplifier section 21 outputs a second output source current I1K and a second output sink current I1I to the first output terminal OP and the second output terminal ON, respectively, based on the second differential-mode currents I1C and I1D.

The first reference current source 12 outputs a first reference source current I1B and a first reference sink current I1A. The first reference source current I1B and the first reference sink current I1A are supplied to the first current amplifier section 11. The second reference current source 22 outputs a second reference source current I1F and a second reference sink current I1G. The second reference source current I1F and the second reference sink current I1G are supplied to the second current amplifier section 21.

The circuit of the differential amplifier 1 is described hereinafter in detail. The first differential pair 10 includes the transistors M11 and M12 of a first conductivity type (e.g. the N-channel type). The transistors M11 and M12 form a differential pair. The sources of the transistors M11 and M12 are connected together in common, and the drain of the transistor M10 is connected to a common connection point. The source of the transistor M10 is connected to the ground terminal GND, and the gate of the transistor M10 is connected to the voltage source V11. The transistor M10 generates a current I10 according to a voltage value of the voltage source V11 and supplies the current I10 as an operating current to the first differential pair 10. The gate of the transistor M11 is connected to the first input terminal IP. The transistor M11 outputs one first differential-mode current I11 according to an input signal through the first input terminal IP. The gate of the transistor M12 is connected to the second input terminal IM.

The transistor M12 outputs the other first differential-mode current I12 according to an input signal through the second input terminal IM.

The first reference current source 12 includes the transistors M1A and M1B of a second conductivity type (e.g. the P-channel type). The gates of the transistors M1A and M1B are connected together. A voltage of the voltage source V12 is applied to the gates of the transistors M1A and M1B. The transistor M1A generates the first reference sink current I1A according to a voltage of the voltage source V12. The transistor M1B generates the first reference source current I1B according to a voltage of the voltage source V12. The source of the transistor M1A is connected to the power supply terminal VDD, and the drain of the transistor M1A is connected to a connection point (e.g. a node N12) with the drain of the transistor M11. The source of the transistor M1B is connected to the power supply terminal VDD, and the drain of the transistor M1B is connected to a connection point (e.g. a node N13) with the drain of the transistor M12.

The first current amplifier section 11 includes the transistors M17 and M18 of the second conductivity type (e.g. the P-channel type) and the transistors M13 to M16 of the N-channel type. The gates of the transistors M17 and M18 are connected together. A voltage of the voltage source V13 is applied to the gates of the transistors M17 and M18. The source of the transistor M17 is connected to the node N12, which is a connection point with the drain of the transistor M11. The source of the transistor M18 is connected to the node N13, which is a connection point with the drain of the transistor M12. The transistors M17 and M18 generate a voltage according to the voltage of the voltage source V13 on the source side. Because the voltage source V13 is a constant voltage source, the source-side voltages of the transistors M17 and M18 are stabilized according to the value of the constant voltage generated by the voltage source V13. The voltages between the source and the drain of the transistors M1A and M1B are thereby stabilized, so that the values of the first reference sink current I1A and the first reference source current I1B are stabilized.

The gates of the transistors M15 and M16 are connected together. A voltage of the voltage source V14 is applied to the gates of the transistors M15 and M16. The source of the transistor M15 is connected to the drain of the transistor M13. The source of the transistor M16 is connected to the drain of the transistor M14. The transistors M15 and M16 generate voltage according to the voltage of the voltage source V14 on the source side. Because the voltage source V14 is a constant voltage source, the source-side voltages of the transistors M15 and M16 are stabilized according to the value of the constant voltage generated by the voltage source V14. The voltages between the source and the drain of the transistors M13 and M14 are thereby stabilized. Consequently, the current mirror ratio of the current mirror circuit formed by the transistors M13 and M14 is stabilized. The gates of the transistors M13 and M14 are connected together in common, and a common connection point is connected to the drain of the transistor M15. The connection point is referred to hereinafter as a node N11. The source of the transistor M13 is connected to the ground terminal GND. The drain of the transistor M13 is connected to the source of the transistor M15. The source of the transistor M14 is connected to the ground terminal GND. The drain of the transistor M14 is connected to the source of the transistor M16.

The first current amplifier section 11 generates a current I17, which is a difference between the first reference sink current I1A and one first differential-mode current I11. The current I17 is turned back by the current mirror circuit formed by the transistors M13 and M14, thereby generating the first output sink current I16. Further, the first current amplifier section 11 generates the first output source current I18 based on a difference between the first reference source current I1B and the other first differential-mode current I12.

The second differential pair 20 includes the transistors M1C and M1D of the P-channel type. The transistors M1C and M1D form a differential pair. The sources of the transistors M1C and M1D are connected together in common, and the drain of the transistor M1E is connected to a common connection point. The source of the transistor M1E is connected to the power supply terminal VDD, and the gate of the transistor M1E is connected to the voltage source V15. The transistor M1E generates a current I1E according to the voltage value of the voltage source V15 and supplies the current I1E as an operating current to the second differential pair 20. The gate of the transistor M1C is connected to the first input terminal IP. The transistor M1C outputs one second differential-mode current I1C according to an input signal through the first input terminal IP. The gate of the transistor M1D is connected to the second input terminal IM. The transistor M1D outputs the other second differential-mode current I1D according to an input signal through the second input terminal IM.

The second reference current source 22 includes the transistors M1F and M1G of the N-channel type. The gates of the transistors M1F and M1G are connected together in common. A voltage of the voltage source V16 is applied to the gates of the transistors M1F and M1G. The transistor M1F generates the second reference source current I1F according to the voltage of the voltage source V16. The transistor M1G generates the second reference sink current I1G according to the voltage of the voltage source V16. The source of the transistor M1F is connected to the ground terminal GND, and the drain of the transistor M1F is connected to a connection point (e.g. a node N14) with the drain of the transistor M1C. The source of the transistor M1G is connected to the ground terminal GND, and the drain of the transistor M1G is connected to a connection point (e.g. a node N15) with the drain of the transistor M1D.

The second current amplifier section 21 includes the transistors M1H and M1I of the N-channel type and the transistors M1J to M1M of the P-channel type. The gates of the transistors M1H and M1I are connected together, and the voltage of the voltage source V14 is applied to the gates of the transistors M1H and M1I. The source of the transistor M1H is connected to a node N14, which is a connection point with the drain of the transistor M1C. The source of the transistor M1I is connected to a node N15, which is a connection point with the drain of the transistor M1D. The transistors M1H and M1I generate voltages according to the voltage of the voltage source V14 on the source side. Because the voltage source V14 is a constant voltage source, the source-side voltages of the transistors M1H and M1I are stabilized according to the value of the constant voltage generated by the voltage source V14. The voltages between the source and the drain of the transistors M1F and M1G are thereby stabilized, so that the values of the second reference sink current I1G and the second reference source current I1F are stabilized.

The gates of the transistors M1J and M1K are connected together, and the voltage of the voltage source V13 is applied to the gates of the transistors M1J and M1K. The source of the transistor M1J is connected to the drain of the transistor M1L. The source of the transistor M1K is connected to the drain of the transistor M1M. The transistors M1J and M1K generate voltages according to the voltage of the voltage source V13 on the source side. Because the voltage source V13 is a constant voltage source, the source-side voltages of the transistors M1J and M1K are stabilized according to the value of the constant voltage generated by the voltage source V13. The voltages between the source and the drain of the transistors M1L and M1M are thereby stabilized. Consequently, the current mirror ratio of the current mirror circuit formed by the transistors M1L and M1M is stabilized. The gates of the transistors M1L and M1M are connected together in common, and a common connection point is connected to the drain of the transistor M1J. The connection point is referred to hereinafter as a node N16. The source of the transistor M1L is connected to the power supply terminal VDD. The drain of the transistor M1L is connected to the source of the transistor M1J. The source of the transistor M1M is connected to the power supply terminal VDD. The drain of the transistor M1M is connected to the source of the transistor M1K.

The second current amplifier section 21 generates a current I1H, which is a difference between the second reference source current I1F and one second differential-mode current I1C. The current I1H is turned back by the current mirror circuit formed by the transistors M1L and M1M, thereby generating the second output source current I1K. Further, the second current amplifier section 21 generates the second output sink current I1I based on a difference between the second reference sink current I1G and the other second differential-mode current I1D.

In the differential amplifier 1, the outputs of the first current amplifier section 11 and the second current amplifier section 21 are both connected to the output terminals. Specifically, a first output source terminal that outputs the first output source current I18 in the first current amplifier section 11 and a second output source terminal that outputs the second output source current I1K in the second current amplifier section 21 are connected to the first output terminal OP. Further, a first output sink terminal that outputs the first output sink current I16 in the first current amplifier section 11 and a second output sink terminal that outputs the second output sink current I1I in the second current amplifier section 21 are connected to the second output terminal ON. In such a configuration, the differential amplifier 1 outputs an output source current IOP which is a combination of the first output source current I18 and the second output source current I1K through the first output terminal OP. Further, the differential amplifier 1 outputs an output sink current IOM which is a combination of the first output sink current I16 and the second output sink current I1I through the second output terminal ON.

The operation of the differential amplifier 1 according to the exemplary embodiment is described hereinafter. Because the operation of the differential amplifier 1 differs by the signal level of an input signal, the operation is described for each signal level of an input signal. In the following description, the signal level of a signal that is input through the input terminal IP is VIP, the signal level of a signal that is input through the input terminal IM is VIM, the threshold voltage of an N-channel transistor is Vthn, and the threshold voltage of a P-channel transistor is Vthp.

First, the operation under first operating conditions where VIP and VIM are equal to or higher than 0V and equal to or lower than Vthn ($0 \leq VIP \leq Vthn$, $0 \leq VIM \leq Vthn$) is described hereinafter. Under the first operating conditions, the first differential pair 10 does not operate normally. Thus, the first differential-mode currents I11 and I12 are negligibly small. On the other hand, the second differential pair 20 operates normally.

Under the first operating conditions, if a differential-mode input voltage (VIP−VIM) is shifted toward the positive (plus) direction, the current I1C flowing through the transistor M1C decreases. Accordingly, the current I1H increases. With the increase in the current I1H, the second output source current I1K increases. Consequently, the output source current IOP increases. On the other hand, the current I1D flowing through the transistor M1D increases. Accordingly, the second output sink current I1I decreases. Consequently, the output sink current IOM decreases.

On the contrary, if the differential-mode input voltage (VIP−VIM) is shifted toward the negative (minus) direction under the first operating conditions, the current I1C flowing through the transistor M1C increases. Accordingly, the current I1H decreases. With the decrease in the current I1H, the second output source current I1K decreases. Consequently, the output source current IOP decreases. On the other hand, the current I1D flowing through the transistor M1D decreases. Accordingly, the second output sink current I1I increases. Consequently, the output sink current IOM increases.

Next, the operation under second operating conditions where VIP and VIM are equal to or higher than VDD (Here, VDD is the voltage that is supplied from the power supply terminal VDD)−Vthp and equal to or lower than VDD (($VDD-Vthp) \leq VIP \leq VDD$, $(VDD-Vthp) \leq VIM \leq VDD$) is described hereinafter. Under the second operating conditions, the first differential pair 10 operates normally. On the other hand, the second differential pair 20 does not operate normally. Thus, the second differential-mode currents I1C and I1D are negligibly small.

Under the second operating conditions, if the differential-mode input voltage (VIP−VIM) is shifted toward the positive (plus) direction, the current I12 flowing through the transistor M12 decreases. Accordingly, the first output source current I18 increases. Consequently, the output source current IOP increases. On the other hand, the current I11 flowing through the transistor M11 increases. Accordingly, the current I17 decreases. With the decrease in the current I17, the first output sink current I16 decreases. Consequently, the output sink current IOM decreases.

On the contrary, if the differential-mode input voltage (VIP−VIM) is shifted toward the negative (minus) direction under the second operating conditions, the current I12 flowing through the transistor M12 increases. Accordingly, the first output source current I18 decreases. Consequently, the output source current IOP decreases. On the other hand, the current I11 flowing through the transistor M11 decreases. Accordingly, the current I17 increases. With the increase in the current I17, the first output sink current I16 increases. Consequently, the output sink current IOM increases.

The operation under third operating conditions where VIP and VIM are equal to or higher than Vthn and equal to or lower than VDD−Vthp ($Vthn \leq VIP \leq (VDD-Vthp)$, $Vthn \leq VIM \leq (VDD-Vthp)$) is described hereinafter. Under the third operating conditions, the first differential pair 10 and the second differential pair 20 both operate normally.

Under the third operating conditions, the operation is a combination of the operation related to the second differential pair 20 under the first operating conditions and the operation related to the first differential pair 10 under the second operating conditions. Specifically, the first output source current I18 and the first output sink current I16 and the second output source current I1K and the second output sink current I1I are output according to variations in the differential-mode input voltage. In the first output terminal OP, the first output source current I18 and the second output source current I1K are combined, and the output source current IOP is output. In the second output terminal ON, the first output sink current I16 and the second output sink current I1I are combined, and the output sink current IOM is output.

As described above, in the differential amplifier 1 according to the exemplary embodiment, in response to a common-mode input voltage on the high potential side, the first differential pair 10 mainly operates to generate the output currents IOP and IOM, and in response to a common-mode input voltage on the low potential side, the second differential pair 20 mainly operates to generate the output currents IOP and IOM. Then, the output of the first current amplifier section 11 corresponding to the first differential pair 10 and the output of the second current amplifier section 21 corresponding to the second differential pair 20 are connected to the same output terminal, thereby combining the output currents generated in the two current amplifier sections.

Therefore, the differential amplifier 1 according to the exemplary embodiment is capable of handling input signals appropriately regardless of the common-mode voltage of the input signals, even if the signal level of the input signals widely varies from the ground voltage level to the power supply voltage level. Further, in the differential amplifier 1, the transistors M13 to M16 in the first current amplifier section 11 form a common-mode current feedback circuit corresponding to the first differential pair 10, and the transistors M1J to M1M in the second current amplifier section 21 form a common-mode current feedback circuit corresponding to the second differential pair 20. Because the common-mode current feedback circuit does not compare the common-mode voltage of the output signal with a prescribed reference value, malfunction of the circuit due to fluctuations during manufacture of transistors or the like does not occur in the differential amplifier 1.

Second Exemplary Embodiment

Figure 2:
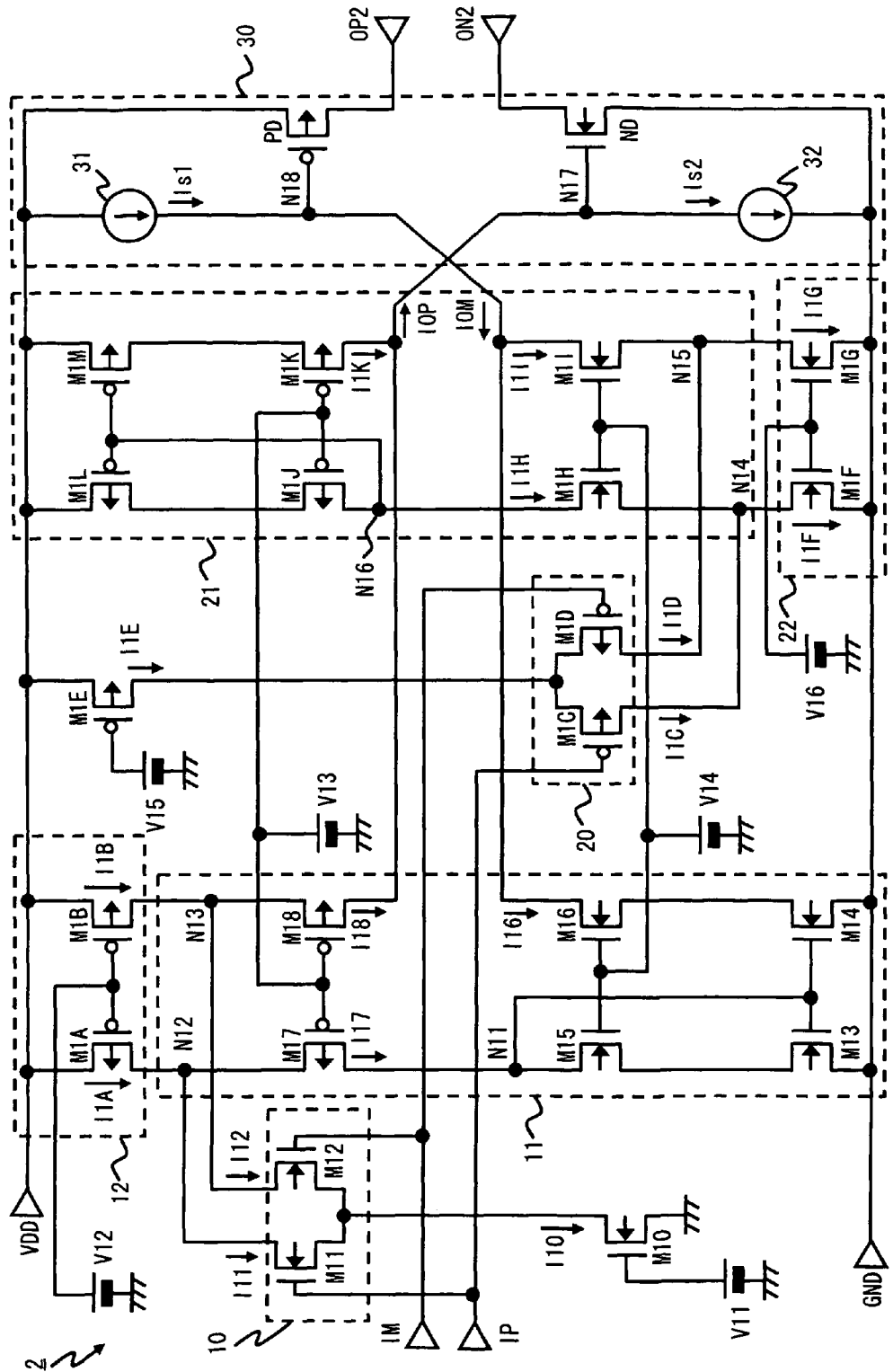
FIG. 2 is a circuit diagram of a differential amplifier according to a second exemplary embodiment.
Figure 3:
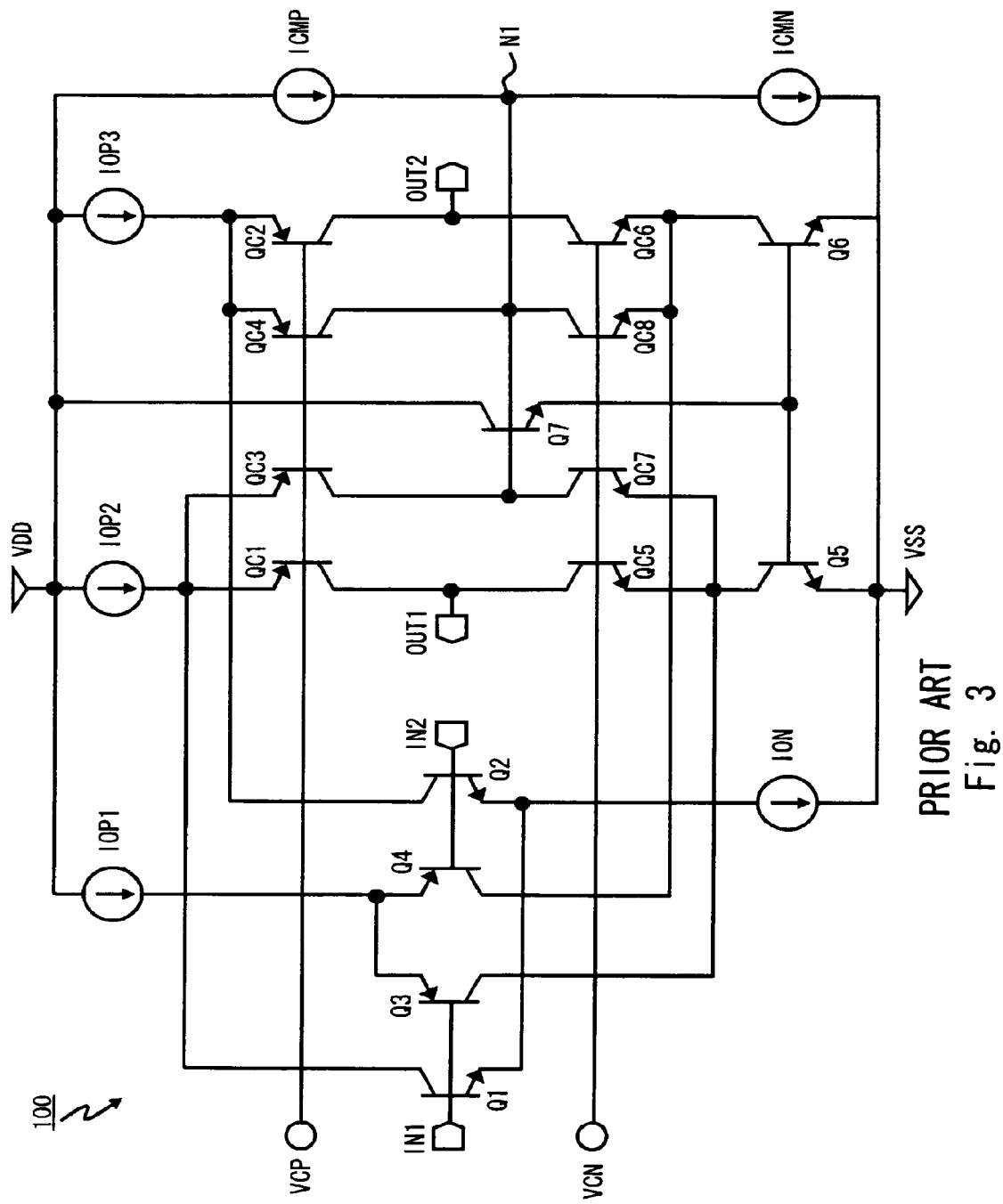
FIG. 3 is a circuit diagram of a differential amplifier according to a prior art.

FIG. 2 shows a circuit diagram of a differential amplifier 2 according to a second exemplary embodiment. Referring to FIG. 2, the differential amplifier 2 is configured by adding an output buffer 30 to the differential amplifier 1 according to the first exemplary embodiment. The output buffer 30 includes constant current sources 31 and 32 and output transistors PD and ND. The constant current source 31 is connected between a node (a node N18) through which the output sink current IOM is output from the differential amplifier 1 and the power supply terminal VDD. The constant current source 32 is connected between a node (a node N17) through which the output source current IOP is output from the differential amplifier 1 and the ground voltage GND. The output transistor PD is a P-channel transistor, for example. The output transistor PD is connected to the power supply terminal VDD through the source, connected to the node N18 through the gate, and connected to a first output terminal OP2 through the drain. The output transistor ND is an N-channel transistor, for example. The output transistor ND is connected to the ground voltage GND through the source, connected to the node N17 through the gate, and connected to a second output terminal ON2 through the drain.

In the output buffer 30, a first control voltage is generated at the node N18 based on a difference between a current Is1 that is output from the constant current source 31 and the output sink current IOM, and the output transistor PD operates based on the first control voltage, thereby outputting an output source current, which is an amplified current of the output sink current IOM. Further, a second control voltage is generated at the node N17 based on a difference between a current Is2 that is output from the constant current source 32 and the output source current IOP, and the output transistor ND operates based on the second control voltage, thereby outputting an output sink current, which is an amplified current of the output source current IOP.

With the output buffer 30 placed as in the differential amplifier 2, it is possible to deal with the case where a large current is needed for the driving of a current in the subsequent stage. In both of the exemplary embodiments 1 and 2, the first and second output terminals may be connected together to form one output terminal.

The first and second exemplary embodiments can be combined as desirable by one of ordinary skill in the art. The differential amplifier according to the exemplary embodiments of the present invention may be configured using bipolar transistors. In this case, an N-channel transistor is replaced with an NPN transistor, and a P-channel transistor is replaced with a PNP transistor. The emitter of a bipolar transistor corresponds to the source of a MOSFET, the collector of a bipolar transistor corresponds to the drain of a MOSFET, and the base of a bipolar transistor corresponds to the gate of a MOSFET.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A differential amplifier comprising:
a first differential pair formed by transistors of a first conductivity type, to receive input signals and output first differential-mode currents;
a first current amplifier section to output a first output source current and a first output sink current to a first output terminal and a second output terminal, respectively, based on the first differential-mode currents;
a second differential pair formed by transistors of a second conductivity type, to receive the input signals and output second differential-mode currents; and
a second current amplifier section to output a second output source current and a second output sink current to the first output terminal and the second output terminal, respectively, based on the second differential-mode currents.

2. The differential amplifier according to claim 1, further comprising:
a first reference current source to output a first reference source current and a first reference sink current; and
a second reference current source to output a second reference source current and a second reference sink current,
wherein the first output source current is generated based on a difference between the first reference source current and one first differential-mode current included in the first differential-mode currents,
the first output sink current is generated based on a difference between the first reference sink current and the other first differential-mode current included in the first differential-mode currents,
the second output source current is generated based on a difference between the second reference source current and one second differential-mode current included in the second differential-mode currents, and the second output sink current is generated based on a difference between the second reference sink current and the other second differential-mode current included in the second differential-mode currents.

3. The differential amplifier according to claim 1, further comprising:
an output buffer to amplify an output source current output from the first output terminal and an output sink current output from the second output terminal.

4. A differential amplifier comprising:
a first differential pair formed by transistors of a first conductivity type, to receive input signals and output first differential-mode currents;
a first reference current source to output a first reference source current and a first reference sink current;
a first current amplifier section to output a first output source current generated based on a difference between the first reference source current and one first differential-mode current included in the first differential-mode currents to a first output terminal, and output a first output sink current generated based on a difference between the first reference sink current and the other first differential-mode current included in the first differential-mode currents to a second output terminal;
a second differential pair formed by transistors of a second conductivity type, to receive the input signals and output second differential-mode currents;
a second reference current source to output a second reference source current and a second reference sink current; and
a second current amplifier section to output a second output source current generated based on a difference between the second reference source current and one second differential-mode current included in the second differential-mode currents to the first output terminal, and output a second output sink current generated based on a difference between the second reference sink current and the other second differential-mode current included in the second differential-mode currents to the second output terminal.

5. The differential amplifier according to claim 4, further comprising:
an output buffer to amplify the output source current output from the first output terminal and the output sink current output from the second output terminal.

* * * * *